United States Patent
Camillo-Castillo et al.

(10) Patent No.: US 8,338,863 B2
(45) Date of Patent: Dec. 25, 2012

(54) VERTICAL HETEROJUNCTION BIPOLAR TRANSISTORS WITH REDUCED BASE-COLLECTOR JUNCTION CAPACITANCE

(75) Inventors: Renata Camillo-Castillo, Essex Junction, VT (US); Erik M. Dahlstrom, Burlington, VT (US); Qizhi Liu, Waltham, MA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/467,385

(22) Filed: May 9, 2012

(65) Prior Publication Data
US 2012/0221987 A1    Aug. 30, 2012

Related U.S. Application Data

(62) Division of application No. 12/939,668, filed on Nov. 4, 2010, now Pat. No. 8,232,156.

(51) Int. Cl.
*H01L 29/737* (2006.01)

(52) U.S. Cl. ......... 257/197; 257/E21.371; 257/E29.189; 257/E51.004; 257/E31.069; 257/E27.053; 438/203; 438/208

(58) Field of Classification Search ............ 257/197, 257/E21.371, E29.189, E51.004, E31.069
See application file for complete search history.

(56) References Cited

U.S. PATENT DOCUMENTS

| | | |
|---|---|---|
| 6,124,180 A | 9/2000 | Chambers et al. |
| 6,506,659 B2 | 1/2003 | Zampardi et al. |
| 7,081,419 B2 | 7/2006 | Chen et al. |
| 7,176,098 B2 | 2/2007 | Kojima et al. |
| 7,750,371 B2 | 7/2010 | Gluschenkov et al. |
| 2004/0087097 A1 | 5/2004 | Lai et al. |
| 2007/0158686 A1* | 7/2007 | Rahimo et al. .............. 257/197 |
| 2009/0020851 A1* | 1/2009 | Liu et al. .................... 257/565 |
| 2009/0283034 A1 | 11/2009 | Natsuhara et al. |

FOREIGN PATENT DOCUMENTS

| | | |
|---|---|---|
| CN | 101707182 A | 5/2010 |
| JP | 05175222 A | 7/1993 |
| JP | 06232148 A | 8/1994 |

OTHER PUBLICATIONS

Cho, et al., "A 42-GHz (fmax) SiGe-base HBT using reduced pressure CVD" Solid-State Electronics vol. 42, Issue 9, 1 Sep. 1998, pp. 1641-1649.

USPTO, Notice of Allowance issued in related U.S. Appl. No. 12/939,668.

* cited by examiner

*Primary Examiner* — Marc Armand

(74) *Attorney, Agent, or Firm* — Wood, Herron & Evans, LLP; Anthony J. Canale

(57) ABSTRACT

Vertical heterojunction bipolar transistors with reduced base-collector junction capacitance, as well as fabrication methods for vertical heterojunction bipolar transistors and design structures for BiCMOS integrated circuits. The vertical heterojunction bipolar transistor includes a barrier layer between the intrinsic base and the extrinsic base that blocks or reduces diffusion of a dopant from the extrinsic base to the intrinsic base. The barrier layer has at least one opening that permits direct contact between the intrinsic base and a portion of the extrinsic base disposed in the opening.

10 Claims, 7 Drawing Sheets

US 8,338,863 B2

VERTICAL HETEROJUNCTION BIPOLAR TRANSISTORS WITH REDUCED BASE-COLLECTOR JUNCTION CAPACITANCE

CROSS-REFERENCE TO RELATED APPLICATIONS

This application is a divisional of application Ser. No. 12/939,668, filed Nov. 4, 2010, which is hereby incorporated by reference herein in its entirety.

BACKGROUND

The invention relates generally to semiconductor device fabrication and, in particular, to vertical heterojunction bipolar transistors with a reduced base-collector junction capacitance, as well as fabrication methods for vertical heterojunction bipolar transistors and design structures for BiCMOS integrated circuits.

Bipolar junction transistors are typically found in demanding types of analog circuits, especially analog circuits used in high-frequency applications. Bipolar junction transistors are found in radiofrequency integrated circuits (RFICs) used in wireless communications systems, as well as integrated circuits requiring high power efficiency, such as power amplifiers in cellular telephones, and other types of high speed integrated circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Conventional bipolar junction transistors include three semiconductor regions, namely the emitter, base, and collector regions. Generally, a bipolar junction transistor includes a pair of p-n junctions, namely an emitter-base junction and a collector-base junction. A heterojunction bipolar transistor (HBT) is a variety of bipolar junction transistor that employs at least two semiconductor materials with unequal band gaps for the emitter and base regions, creating a heterojunction. For example, the extrinsic base of a HBT may be composed of silicon germanium (SiGe), which is a compound semiconductor characterized by a narrower band gap than silicon typically composing the emitter of the HBT.

Improved device are needed for HBT's that boost device performance, as well as improved fabrication methods for HBT's and design structures for BiCMOS integrated circuits.

BRIEF SUMMARY

In an embodiment of the invention, a method is provided for fabricating a vertical heterojunction bipolar transistor. The method includes forming a first layer composed of a material capable of forming an intrinsic base and forming a second layer composed of a second material on the first layer. An opening is formed that extends through the second layer to land on the first layer. The method further includes forming a third layer composed of a third material containing a concentration of a dopant and capable of forming an extrinsic base on the second layer. A portion of the third layer extends through the opening in the second layer to directly contact the first layer. The second layer operates to block or reduce diffusion of the dopant from the third layer to the first layer outside of the opening.

In an embodiment of the invention, a vertical heterojunction bipolar transistor includes an emitter, a collector defined in the substrate, an intrinsic base arranged vertically between the emitter and the collector, and an extrinsic base composed of a semiconductor material containing a dopant. A barrier layer is at least partially disposed between the intrinsic base and the extrinsic base. The barrier layer has an opening occupied by a portion of the extrinsic base to permit direct contact between the intrinsic base and the extrinsic base. The barrier layer is configured to block or reduce diffusion of the dopant from the semiconductor material of the extrinsic base to the intrinsic base outside of the opening.

In another embodiment, the vertical heterojunction bipolar transistor is included in a design structure, which is embodied in a machine readable storage medium for designing, manufacturing, or testing an integrated circuit. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
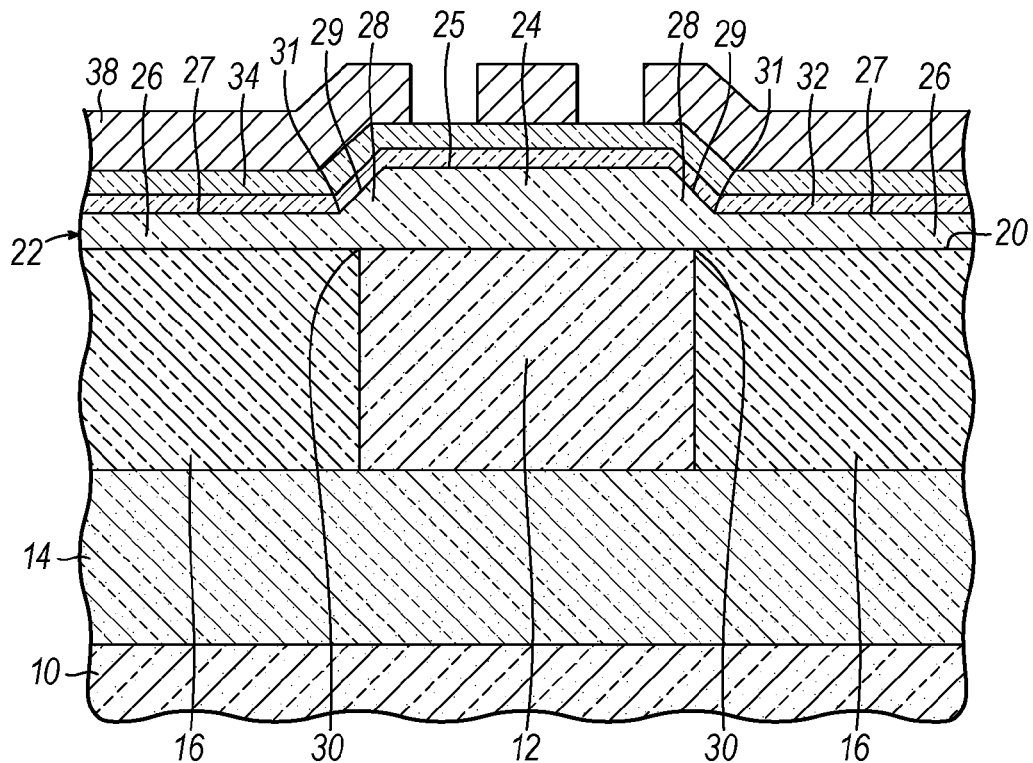
FIG. 1 is a cross-sectional view of a portion of a substrate at an initial fabrication stage of a processing method for fabricating a device structure in accordance with an embodiment of the invention.

With reference to FIG. 1 and in accordance with an embodiment of the invention, a substrate 10 is composed of a semiconductor material. Substrate 10 may be any suitable bulk substrate containing a semiconductor material that a person having ordinary skill in the art would recognize as suitable for forming an integrated circuit. For example, substrate 10 may be composed of a monocrystalline silicon-containing material, such as single crystal silicon with a (100) crystal lattice orientation. The monocrystalline semiconductor material contained in the substrate 10 may contain a definite defect concentration and still be considered single crystal. The semiconductor material constituting substrate 10 may be lightly doped with an impurity to alter its electrical properties. Specifically, the substrate 10 may be lightly doped with a p-type impurity species, such boron, to render it initially p-type.

A collector 12 and a subcollector 14 of a heterojunction bipolar transistor 62 (FIG. 4) are defined as regions in the substrate 10. The collector 12 and subcollector 14 are doped with different concentrations of a dopant, such as an impurities species from Group V of the Periodic Table (e.g., arsenic) effective to impart an n-type conductivity in which electrons are the majority carriers and dominate the electrical conductivity of the semiconductor material. The collector 12 and the subcollector 14 may be formed by ion implantation of an n-type dopant and annealing to activate the dopant using techniques and conditions familiar to one skilled in the art. For example, the collector 12 may comprise a selectively implanted collector (SIC) formed by implanting an n-type dopant with selected dose and kinetic energy.

Trench isolation regions 16 are formed by a conventional process in the substrate 10. In one embodiment, the trench isolation regions 16 may be formed by a shallow trench isolation (STI) technique that relies on a lithography and dry etching process to define closed-bottomed trenches in substrate 10, fills the trenches with dielectric, and planarizes the layer to a top surface 20 of the substrate 10 using a chemical mechanical polishing (CMP) process. The dielectric may be an oxide of silicon, such as densified tetraethylorthosilicate (TEOS) deposited by thermal chemical vapor deposition (THCVD) or a high-density plasma (HDP) oxide deposited with plasma assistance. The trench isolation regions 16 circumscribe and electrically isolate a region of the substrate 10 that is used in the fabrication of the heterojunction bipolar transistor 62 (FIG. 5) and that contains the collector 12.

A layer 22, which is composed of a material suitable for an intrinsic base of heterojunction bipolar transistor 62, is deposited on the top surface 20 of substrate 10. The layer 22 may be formed using a low temperature epitaxial (LTE) growth process (typically at a growth temperature ranging from 450° C. to 850° C.). Layer 22 may contain a semiconductor material composed of silicon (Si) and germanium (Ge) in a SiGe alloy having a germanium content in a range between about 5 atomic percent and about 50 atomic percent. The germanium content of the layer 22 may be uniform or the germanium content of layer 22 may be graded or stepped across the thickness of layer 22.

Layer 22 includes a raised region 24 laterally positioned in vertical alignment with the collector 12, a pedestal region 26 encircling the raised region 24 and overlying the trench isolation regions 16, and a facet region 28 connecting the raised and pedestal regions 24, 26. In the representative embodiment, the facet region 28 has a ring shape. Layer 22 is monocrystalline in the raised region 24, which overlies a region of the substrate 10 that is encircled by the trench isolation regions 16 and that contains the collector 12. The semiconductor material of layer 22 is polycrystalline in the pedestal region 26 and may be a mixture of polycrystalline and monocrystalline in facet region 28 or primarily monocrystalline in facet region 28. The thickness of the layer 22 may range from about 40 nm to about 600 nm with the greatest layer thickness in the raised region 24. As the thickness of layer 22 increases, the width of the raised region 24 likewise increases so that the facet region 28 moves laterally outward relative to the centerline of the raised region 24.

The facet region 28 of layer 22 extends about the perimeter of the raised region 24 of layer 22 and is inclined relative to the top surface 20 of substrate 10. Each trench isolation region 16 includes a corner 30 is defined at the top surface 20 of the substrate 10. The raised region 24 has a substantially planar top surface 25, the pedestal region 26 has a top surface 27, and the facet region 28 has an inclined surface 29 extending between the top surfaces 25, 27. The facet region 28 converges with the pedestal region 26 along a corner 31, which may be approximately aligned vertically with the corner 30 of the trench isolation regions 16.

A layer 32, which contains a material with a different composition than layer 22, is deposited on layer 22. Layer 32 may be composed of a dielectric, which is an insulating material having a lesser degree of electrical conduction and a higher dielectric constant than layer 22. In one embodiment, layer 32 may be a high temperature oxide (HTO) deposited using low pressure chemical vapor deposition (LPCVD) at temperatures of 500° C. or higher, and may be composed of an oxidized silicon, such as stoichiometric $SiO_2$. Alternatively, layer 32 may be deposited by another suitable oxide formation process. The physical layer thickness of layer 32 may be on the order of about 15 nm.

Figure 1A:
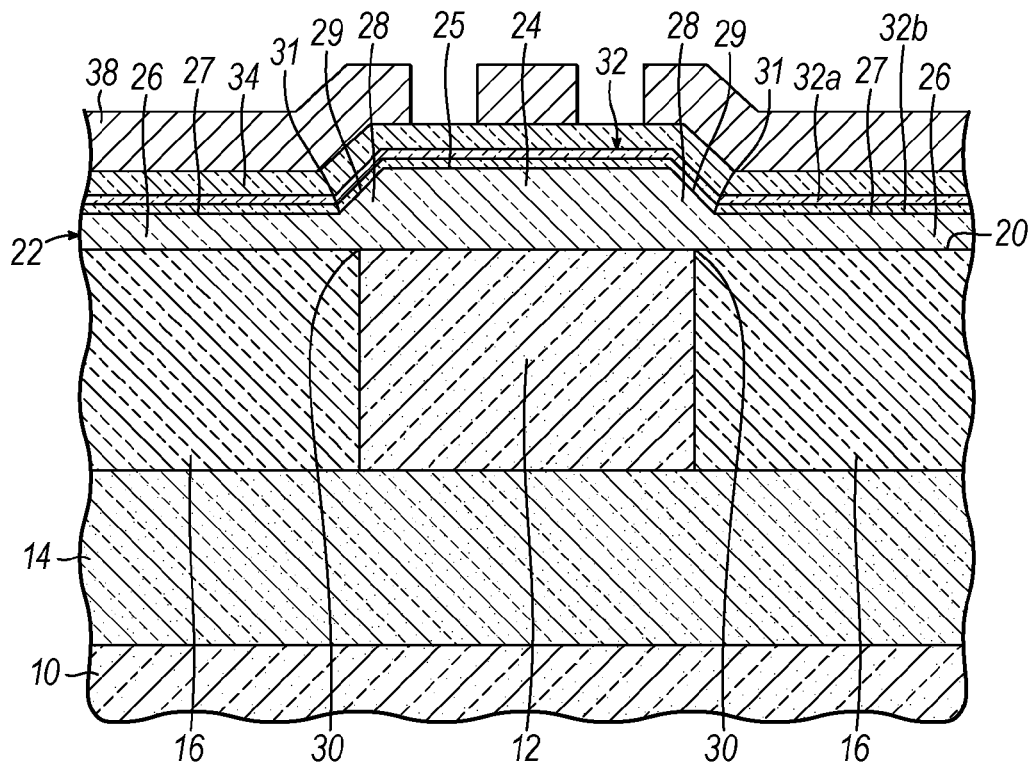
FIG. 1A is a cross-sectional view similar to FIG. 1 in accordance with an alternative embodiment of the invention.

In accordance with an alternative embodiment and with reference to FIG. 1A, layer 32 may include multiple layers 32a, 32b composed of one or more dielectrics, such as a bilayer consisting of a silicon dioxide ($SiO_2$) layer and a $Si_3N_4$ layer in which the oxide layer is preferably disposed between the nitride layer and layer 22. Each of the layers 32a, 32b can contribute to blocking or reducing the diffusion of the dopant from layer 46 (FIG. 3), as described below, into layer 22. The individual contribution of each of the layers 32a, 32b to the barrier function of layer 32 can be selected by appropriate choices of layer thicknesses and layer compositions as understood by a person having ordinary skill in the art.

With renewed reference to FIG. 1, a layer 34, which contains a material with a different composition than layer 32, is deposited on layer 32. In one embodiment, the layer 34 is composed of polycrystalline silicon (polysilicon) that may be deposited by LPCVD and that may be doped with a p-type dopant during deposition.

An opening 36 (FIG. 2) is formed in the layers 32, 34 using photolithography and subtractive etching processes. To that end, the layer stack consisting of layers 32, 34 is masked with a patterned mask layer 38. In one embodiment, the mask layer 38 is a photoresist layer composed of a sacrificial organic material applied by spin coating. The photolithography process entails exposing the photoresist layer to radiation imaged through a photomask and developing the resultant latent feature pattern in the exposed resist to define residual areas that mask portions of layer 34.

Figure 2:
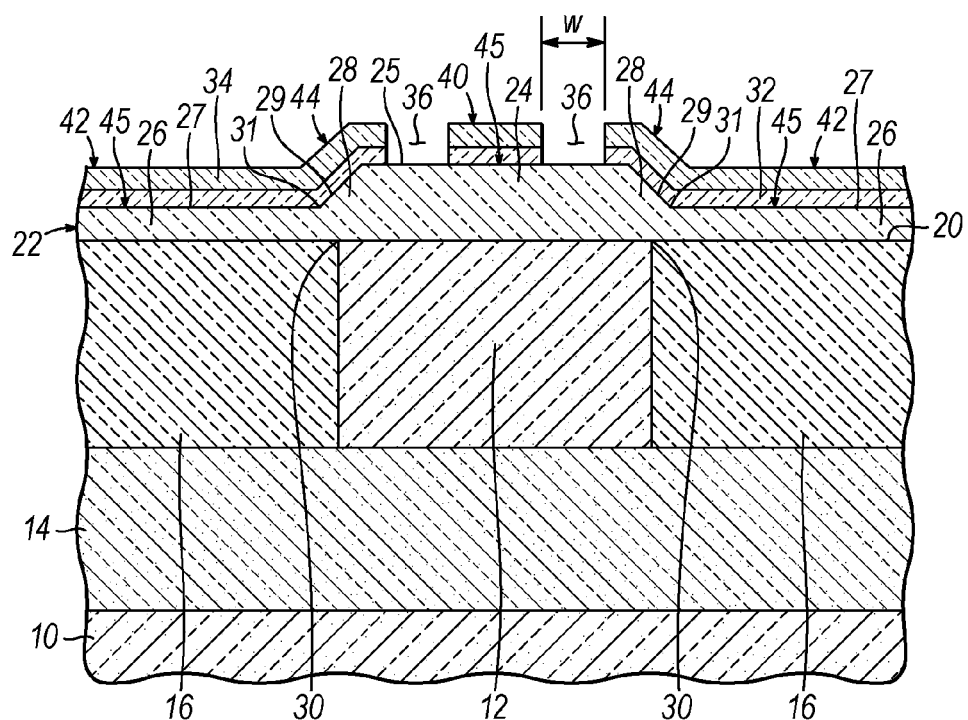
FIG. 2 is a cross-sectional view similar to FIG. 1 at a fabrication stage subsequent to FIG. 1.
Figure 2A:
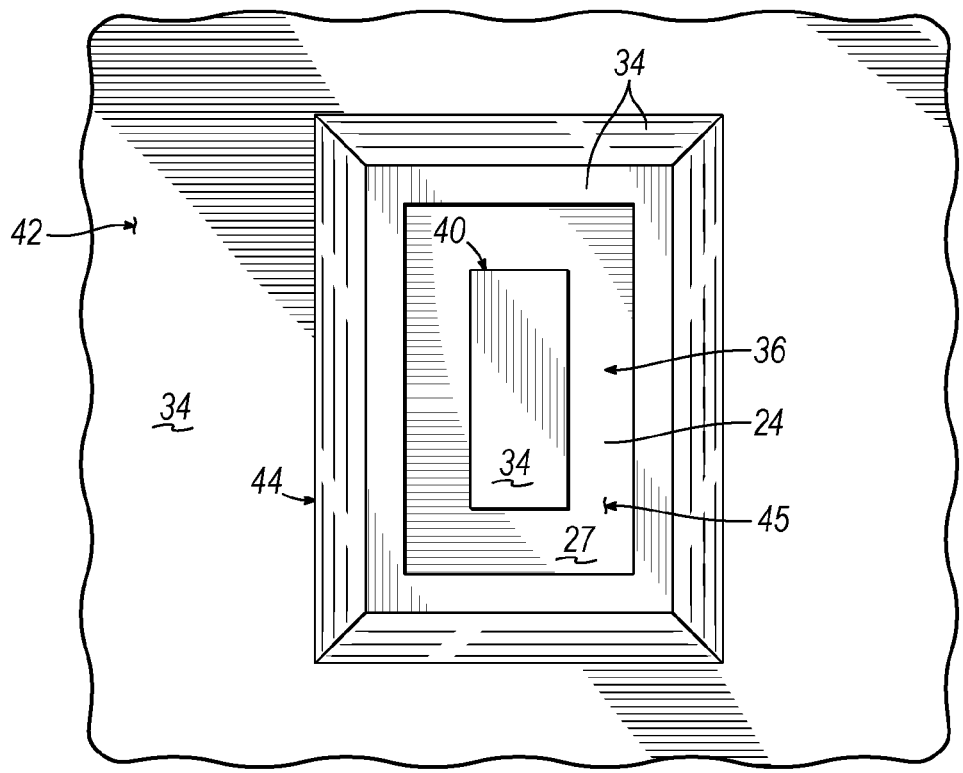
FIG. 2A is a top view of the substrate at the fabrication stage of FIG. 2.

With reference to FIGS. 2 and 2A in which like reference numerals refer to like features in FIG. 1 and at a subsequent fabrication stage, the layer stack consisting of layers 32, 34 is subjected to the subtractive etching process, which removes regions of layers 32, 34 exposed through the mask layer 38 to form the opening 36. The opening 36 is initially extended through layer 34 by an etching process, such as a reactive-ion etching (RIE) process or a wet chemical (e.g., buffered or dilute HF) etching process. The initial etching process stops on the material of layer 32. The opening 36 is then extended through layer 32 to the depth of layer 22 by changing the chemistry of the etching process. In one embodiment, a chemical oxide removal (COR) etching process is used to remove material from layer 32 to deepen the opening 36.

At the conclusion of the etching process, the opening 36 extends through both layers 32, 34 to the depth of the layer 22. In the representative embodiment, the opening 36 is ring-shaped. The opening 36 partitions the layer stack consisting of the residual portions of layers 32, 34 into a central strip 40 circumscribed by the opening 36, a pedestal region 42 surrounding the central strip 40, and a facet region 44 that overlies the facet region 28. The facet region 44 is continuous with the pedestal region 42, as shown in the representative embodiment, and is separated from the central strip 40 by the opening 36. The central strip 40 of stacked layers 32, 34 operates as an emitter landing pad and is disposed entirely on the raised region 24 of layer 22.

The facet region 44 of layer 32 has a surface that directly contacts and covers the surface 29 of the facet region 28 of layer 22. As a result, the facet region 44 of layer 32 also extends about the perimeter of the raised region 24 of layer 22 in an overlying relationship with facet region 28 and is inclined relative to the top surface 20 of substrate 10. The central strip 40 of layer 32 is positioned on the top surface 25 of the raised region 24 of layer 22. The pedestal region 42 of layer 32 is positioned on the top surface 27 of the pedestal region 26 of layer 22. An interface 45 is defined along the directly contacting surfaces of layers 22, 32. The opening 36 exposes a portion of the top surface 25 of the raised region 24 of layer 22 and, in the representative embodiment, is positioned relative to the raised region 24 such that a portion of layer 32 disposed on the top surface 25 is continuous with the facet region 44 of layer 32. After the opening 36 is defined, the mask layer 38 is removed. If composed of photoresist, the mask layer 38 may be removed by ashing or solvent stripping.

The opening 36 has a width, w, that can be adjusted according to match a desired device structural configuration. In the representative embodiment, the opening 36 lands only on the raised region 24 of layer 22. However, the opening 36 can be widened so that the opening 36 also lands at least in part on the facet region 28 of layer 32 and exposed a portion of the surface 29 of facet region 28. The lateral position of the opening 36 can also be adjusted relative to a centerline of the raised region 24 in accordance with a desired device structural configuration. However, a limitation on the width, w, of the opening 36 in layer 32 and 34 is that the layer 32 should cover and overlie the corner 31 defined at the convergence of the pedestal and facet regions 26, 28.

Figure 2B:
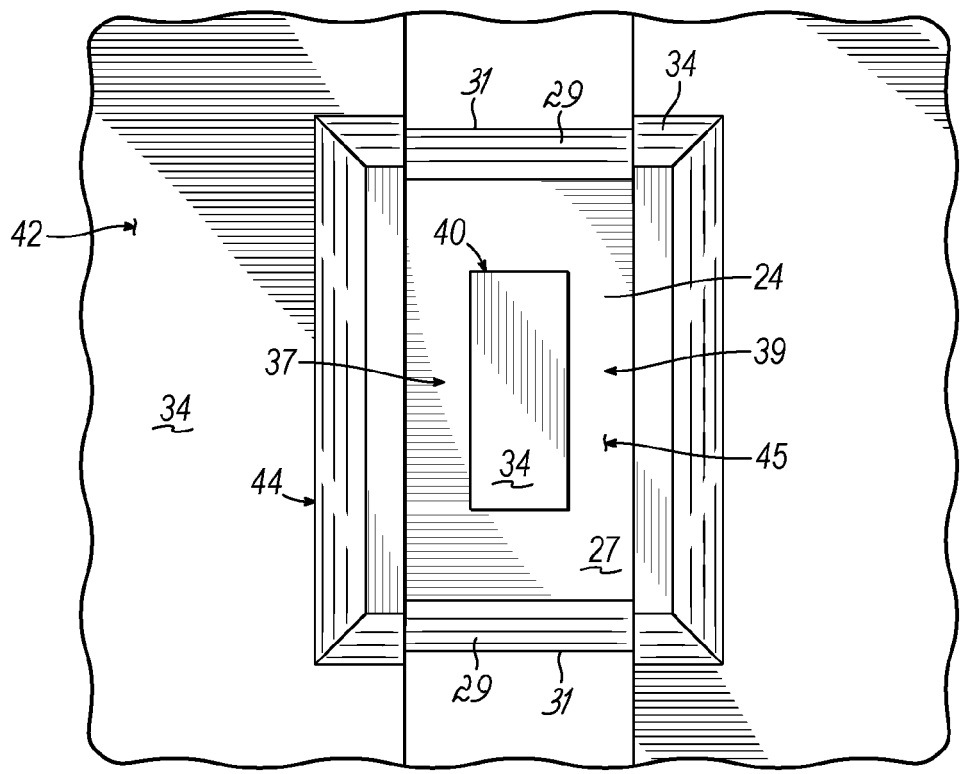
FIG. 2B is a top view similar to FIG. 2A in accordance with an alternative embodiment of the invention.

With reference to FIG. 2B in which like reference numerals refer to like features in FIG. 2B and in accordance with an alternative embodiment of the invention, multiple openings 37, 39 extend through layers 32, 34 to the depth of the layer 22 as a substitute for the opening 36 having a closed geometrical shape. The openings 37, 39 have open ends in contrast to the closed geometrical shape of opening 36 and preferably have a parallel arrangement.

Figure 3:
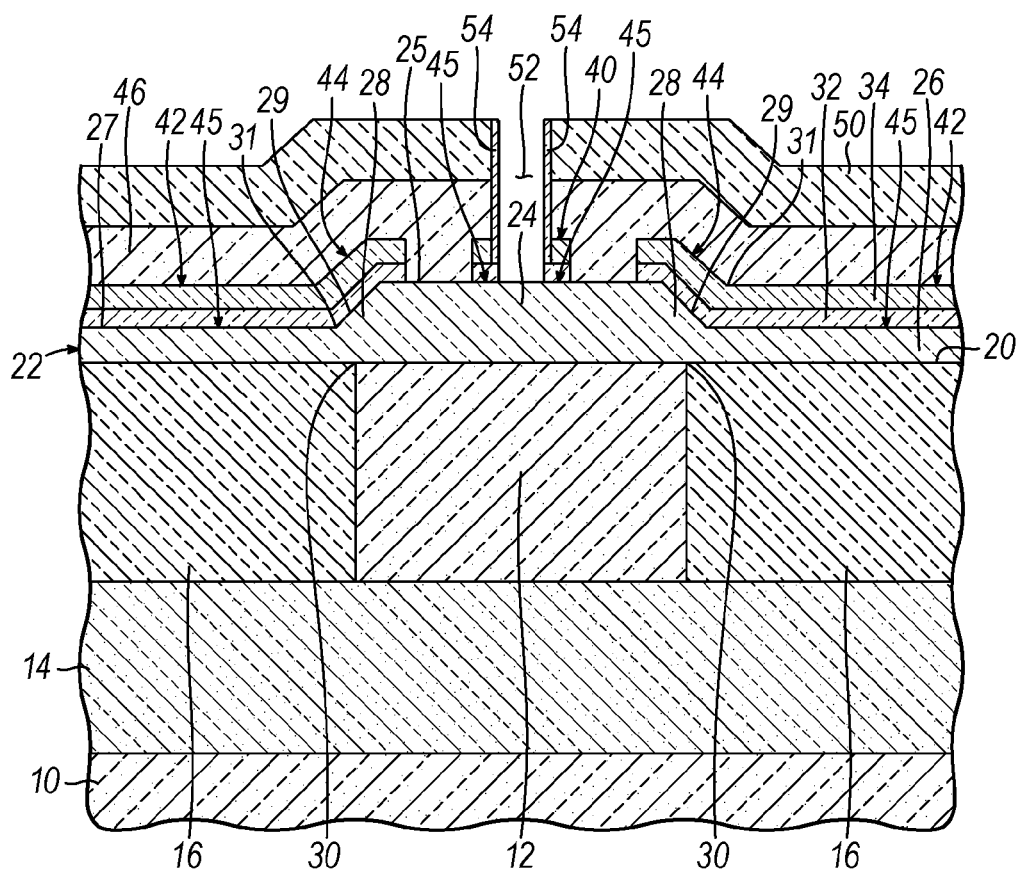
FIGS. 3-5 are cross-sectional views similar to FIG. 2 at fabrication stages subsequent to FIG. 2.

With reference to FIG. 3 in which like reference numerals refer to like features in FIG. 2 and at a subsequent fabrication stage, a layer 46 composed of a material suitable to form an extrinsic base of the heterojunction bipolar transistor 62 (FIG. 5) is deposited on layer 34. The semiconductor material of layer 46 may be a single layer composed of silicon, a single layer composed of an alloy of silicon and germanium (SiGe), a layered stack containing silicon and SiGe layers, a graded SiGe layer, or combinations thereof. Layer 46 may be deposited by a LTE growth process and in-situ doped with a concentration of a dopant, such as an impurity species from Group III of the Periodic Table (e.g., boron) effective to impart a p-type conductivity in which holes are the majority carriers and dominate the electrical conductivity of the constituent semiconductor material. Other atomic species, such as carbon (C), may be optionally introduced into the semiconductor material of layer 46 and incorporated along with the conductivity dopant during the deposition process. Layer 46 has an epitaxial relationship with the material in the raised region 24 of layer 22 because layer 22 acts as a seed crystal and layer 46 acquires a lattice structure and orientation identical to those of layer 22. A portion of the material from layer 46 occupies and fills the opening 36 such that the layer 46 has a directly contacting relationship with layer 22. If openings 37, 39 (FIG. 2B) are present, then respective portions of the semiconductor material from layer 46 occupy and fill each of the openings 37, 39 such that portions of layer 46 have a directly contacting relationship with layer 22.

Outside of the opening 36 or outside of the openings 37, 39 (FIG. 2B), layer 32 is disposed between the material of layer 22 and the material of layer 46. The material of layer 32 is selected such that the dopant in layer 46 is blocked from thermally diffusing from layer 46 into layer 22 across the interface 45 between layers 22 and 32. Alternatively, the diffusion of the dopant from layer 46 to layer 22 may be reduced in comparison with conventional constructions that entirely omit layer 32. Layer 34, which may be similar in composition to layer 46, may be considered to merge with layer 46 despite the depiction of layer 34 as a distinct structure in FIG. 3 and the dopant in layer 46 may diffuse across the thickness of layer 34.

A non-conductive insulating layer 50 is applied on layer 46. The insulating layer 50 may be a dense silicon dioxide deposited utilizing a conventional deposition process, such as THCVD using TEOS as a reactant, and may have a thickness after formation of about 100 nm. Layer 34, layer 46, and insulating layer 50 are patterned using photolithography and subtractive etching processes to define an emitter window 52 as an opening that extends to the depth of, and lands on, the emitter landing pad defined by the central strip 40 of layer 32. A two-step subtractive etching process is used that has a chemistry that is effective to etch the material of layer 50 and then a different chemistry that is effective to etch the material of layers 46 and 34. The latter portion of the etching process stops on the material of layer 32.

Spacers 54 are formed on the sidewalls of the portions of layers 34, 46 that border the emitter window 52. In a representative embodiment, the spacers 54 are formed from a non-conductive, dielectric material that is shaped by a directional anisotropic etching process, such as a RIE process, to preferentially remove the dielectric material from horizontal surfaces. The dielectric material used to form the spacers 54 may be a thin layer of $Si_3N_4$ deposited by chemical vapor deposition (CVD) or a bilayer consisting of thin discrete layers of $Si_3N_4$ and $SiO_2$. An etching process, such as COR, that stops on layer 22 is used to remove the material of layer 32 exposed by the emitter window 52.

Figure 4:
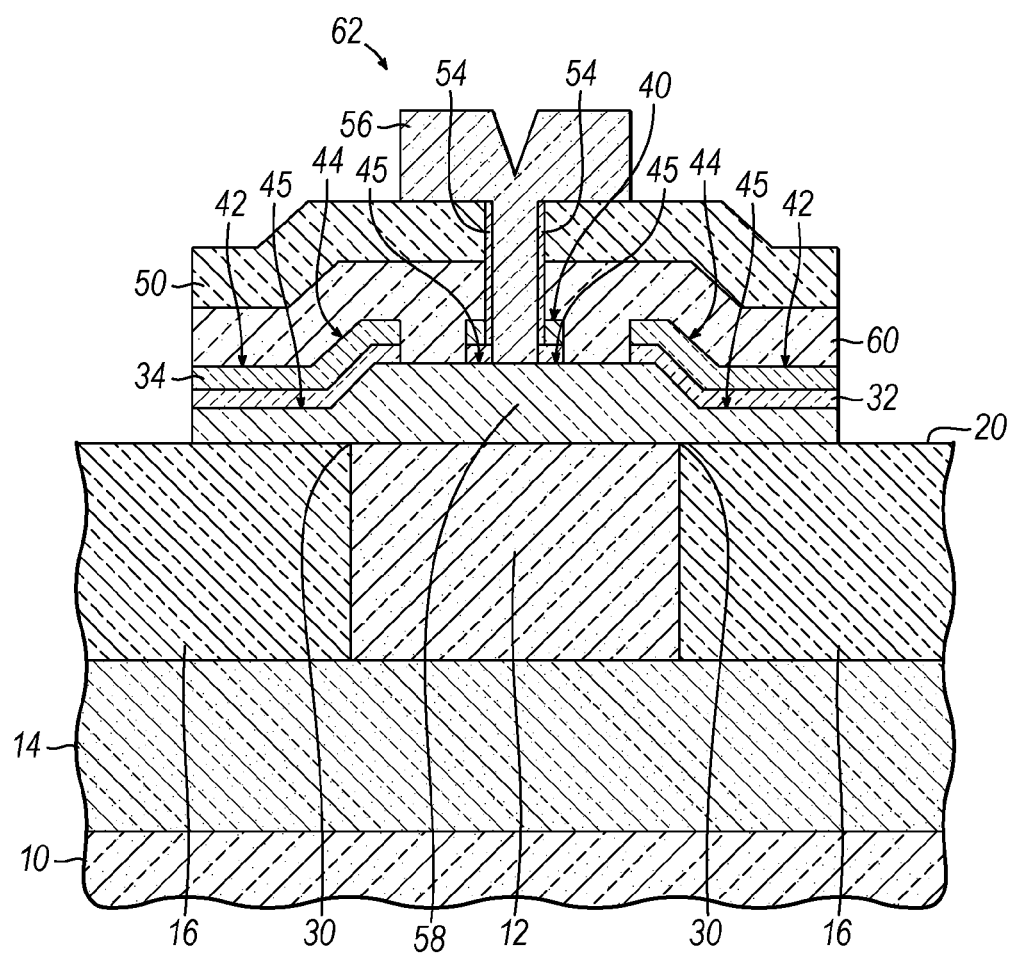

With reference to FIG. 4 in which like reference numerals refer to like features in FIG. 3 and at a subsequent fabrication stage, an emitter 56 of the heterojunction bipolar transistor 62 (FIG. 5) is then formed by depositing a layer composed of a heavily-doped semiconductor material and then patterning the layer with a lithography and etching process. For example, the emitter 56 may be formed from polysilicon heavily doped with a concentration of a dopant, such as an impurities species from Group V of the Periodic Table (e.g., arsenic) effective to impart an n-type conductivity in which electrons are the majority carriers and dominate the electrical conductivity of the semiconductor material. An optional layer of a dielectric material, such as $Si_3N_4$, may be applied before the emitter 56 is patterned.

A portion of the doped semiconductor material fills the emitter window 52 and is directly connected with layer 22. Another portion of the doped semiconductor material covers the insulating layer 50 and projects above the portion filling the emitter window 52. If openings 37, 39 (FIG. 2B) are present, then emitter window 52 is positioned laterally between the openings 37, 39.

The lithography process forming emitter 56 from the layer of doped semiconductor material may utilize a negative photoresist to mask only a strip of the doped semiconductor material above the portion of the layer filling the emitter window 52. The emitter 56 is shaped with a selective etching process that stops on the material of insulating layer 50. The mask is stripped from the surface after shaping the emitter 56.

A top surface of layer 50 is exposed after the emitter 56 is formed. Layers 22, 32, 34, 46, and 50 are then patterned using photolithography and etching processes with a different mask to define an intrinsic base 58 of the heterojunction bipolar transistor 62 from the residual portion of layer 22 and an extrinsic base 60 of the heterojunction bipolar transistor 62 from the residual portion of layer 46. The heterojunction bipolar transistor 62 has a vertical architecture in which the intrinsic base 58 is located between the emitter 56 and the collector 12, and the emitter 56, intrinsic base 58, and the collector 12 have a vertical arrangement. The extrinsic base 60 extends laterally to permit contact access to the intrinsic base 58. The spacers 54 function to isolate the emitter 56 from the extrinsic base 60.

The n-conductivity type of the semiconductor material of emitter 56 is opposite to the p-type conductivity type of the constituent semiconductor material of the layer 46 used to define the extrinsic base 60. The semiconductor material of the extrinsic base 60, which may be a SiGe alloy doped with boron and/or carbon, may have a narrower band gap than the materials (e.g., silicon) of the emitter 56 and collector 12, in which case the heterojunction bipolar transistor 62 has a Si/SiGe heterojunction. In a representative construction, the extrinsic base 60 may be composed of boron-doped Si.

Layer 32, which is intervening between layers 22 and 46, functions to block or at the least significantly reduce dopant diffusion from the portion of layer 46 constituting the raised extrinsic base 60 into the portion of layer 22 constituting the intrinsic base 58. The ability of layer 32 to act as a barrier layer that blocks or significantly reduces thermally-induced diffusion of the dopant is contingent upon the physical layer thickness and the layer composition among other factors. Layer 32 is retained in an intact condition near the corner 30 so that layer 32 at least overlaps the corner 30 of each trench isolation region 16, which prevents or reduces dopant diffusion from the extrinsic base 60 toward the corner 30. As a consequence of the reduced or eliminated dopant diffusion, the emitter-base junction of the heterojunction bipolar transistor 62 will exhibit a reduced collector-base capacitance (Ccb). The reduction in the parasitic capacitance represented by the reduced Ccb improves the performance of the heterojunction bipolar transistor 62 by increasing figures of merit such as the cut-off frequency $f_T$ and the maximum operating frequency $f_{max}$. The reduced or eliminated dopant diffusion also increases the collector-to-base breakdown voltage ($BV_{CBO}$) of the heterojunction bipolar transistor 62 and reduces the variability of the $BV_{CBO}$ so that the $BV_{CBO}$ is higher and tighter. In addition, a safe operating area (SOA), which may be defined as the voltage and current conditions over which power switching device can be expected to operate without self-damage and destructive failure, is enlarged for the heterojunction bipolar transistor 62.

Figure 5:
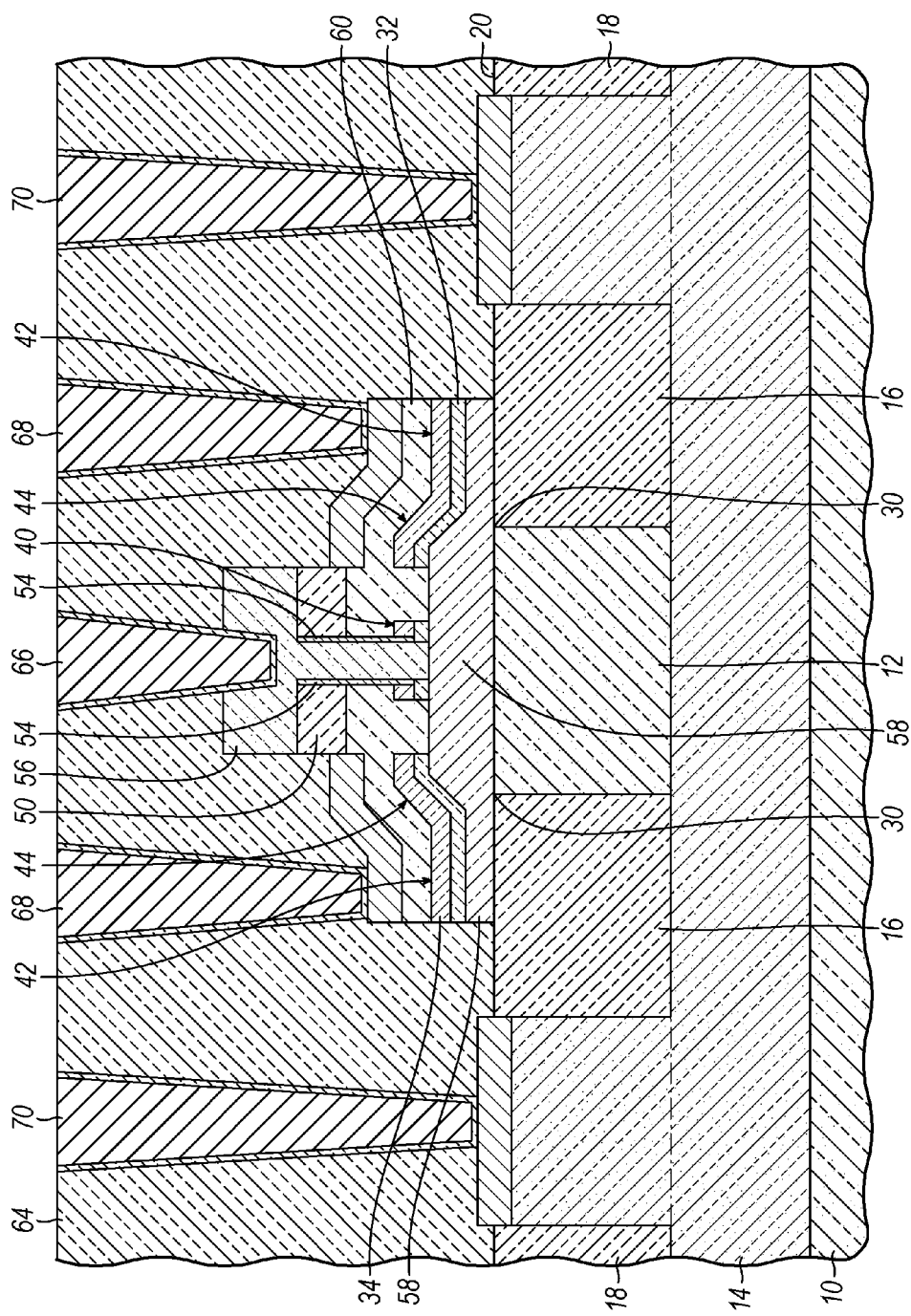

With reference to FIG. 5 in which like reference numerals refer to like features in FIG. 4 and at a subsequent fabrication stage, at least one contact 66 is formed in a dielectric layer 64 that lands on the emitter 56, at least one contact 68 is formed in the dielectric layer 64 that lands on the extrinsic base 60, and at least one contact 70 is formed in the dielectric layer 64 that is electrically coupled with the collector 12. The surfaces of the emitter 56, extrinsic base 60, and collector 12 contacted by the contacts 66, 68, 70 may be silicided, as shown in FIG. 5.

The dielectric layer 64 may be composed of any organic or inorganic electrically-insulating material recognized by a person having ordinary skill in the art, which may be deposited by any of number of well known conventional techniques such as sputtering, spin-on application, a CVD process, or a plasma enhanced CVD (PECVD) process. Each of the contacts 66, 68, 70 includes a conductive plug and a liner that separates from the metallic plug from the dielectric material of layer 64. The conductive plugs may be composed of any suitable conductive material such as tungsten (W) deposited by a conventional deposition process. The liners may be composed of one or more layers of stoichiometric or non-stoichiometric metal nitrides, such as titanium nitride (TiN) and tantalum nitride (TaN), a titanium/titanium nitride bilayer, a tantalum/tantalum nitride bilayer, a metal alloy, and other suitable materials deposited utilizing a conventional deposition process.

During the front-end-of-line (FEOL) portion of the fabrication process, the device structure of the heterojunction bipolar transistor 62 is replicated across at least a portion of the surface area of the substrate 10. In BiCMOS integrated circuits, complementary metal-oxide-semiconductor (CMOS) transistors (not shown) are formed using other regions of the substrate 10. As a result, both bipolar and CMOS transistors available on the same substrate 10.

Standard back-end-of-line (BEOL) processing follows, which includes formation of contacts like contacts 66, 68, 70 and metallization for the local interconnect wiring, and formation of dielectric layers, conductive vias, and metallization for interconnect wiring coupled by the local interconnect wiring with the contacts 66, 68, 70 for heterojunction bipolar transistor 62, as well as other similar contacts for additional device structures like heterojunction bipolar transistor 62 and CMOS transistors (not shown) included in other circuitry fabricated on the substrate 10. Other passive circuit elements, such as resistors, capacitors, varactors, and inductors, may be fabricated on substrate 10 and available for use in the BiCMOS integrated circuit.

Figure 6:
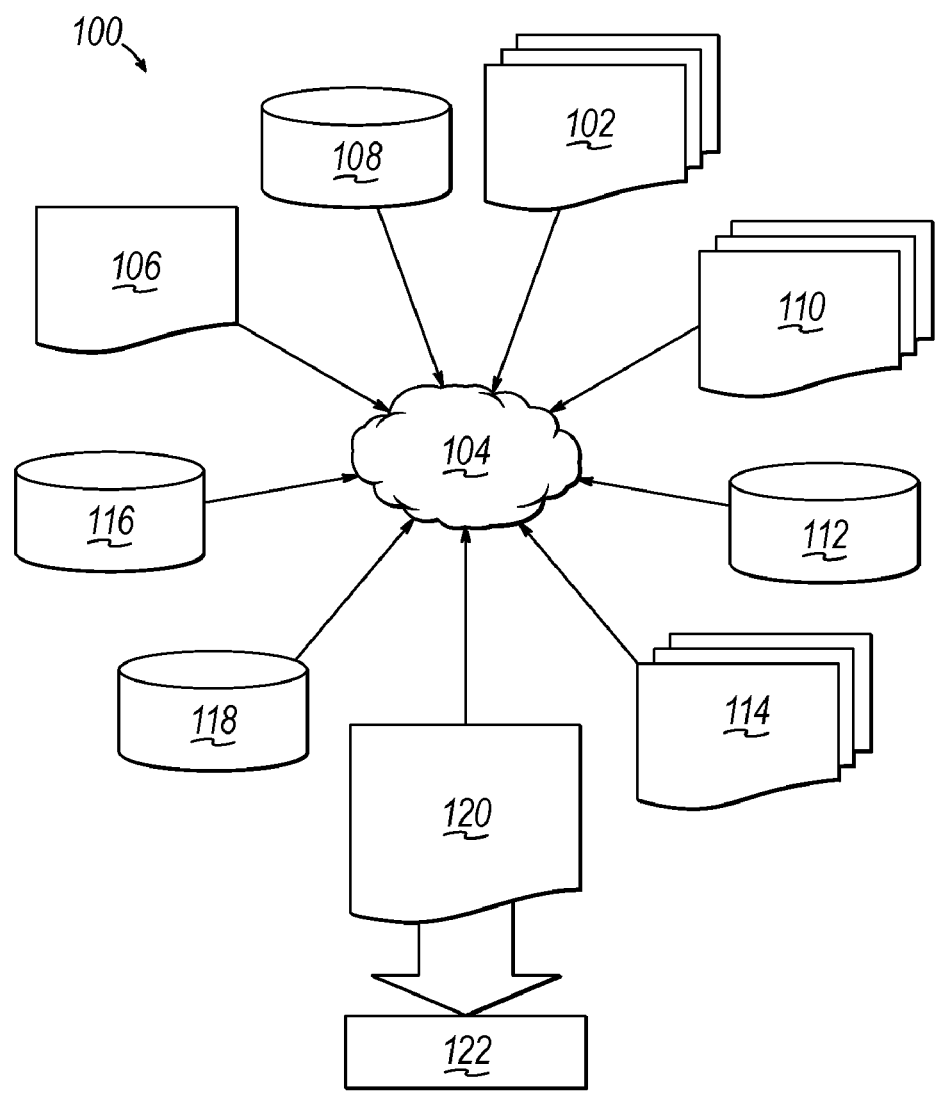
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 4. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 4. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 4 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 4. In one embodiment, design structure 120 may comprise a compiled, executable HDL simulation model that functionally simulates the devices shown in FIG. 4.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 4. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A design structure embodied in a machine readable medium for designing, manufacturing, or testing an integrated circuit, the design structure comprising:

a vertical heterojunction bipolar transistor including an emitter, a collector, an intrinsic base vertically between the emitter and the collector, an extrinsic base comprised of a semiconductor material containing a dopant, and a barrier layer at least partially disposed between the intrinsic base and the extrinsic base, the barrier layer having a first opening that permits direct contact between the intrinsic base and a portion of the extrinsic base disposed in the first opening, and the barrier layer configured to block or reduce diffusion of the dopant from the semiconductor material of the extrinsic base to the intrinsic base outside of the first opening.

2. The design structure of claim 1 wherein the design structure comprises a netlist.

3. The design structure of claim 1 wherein the design structure resides on storage medium as a data format used for the exchange of layout data of integrated circuits.

4. The design structure of claim 1 wherein the design structure resides in a programmable gate array.

5. The design structure of claim 1 wherein the first material is comprised of silicon and germanium, the second material is comprised of a dielectric, the third material is comprised of silicon or an alloy containing silicon and germanium, and the dopant in the third material is a p-type dopant.

6. The design structure of claim 1 further comprising:
   a plurality of trench isolation regions that surround an active region of a substrate containing the collector.

7. The design structure of claim 1 wherein the barrier layer is configured to block diffusion of the dopant from the extrinsic base to the intrinsic base.

8. The design structure of claim 1 wherein the extrinsic base and the intrinsic base have an identical lattice structure and an identical orientation.

9. The design structure of claim 5 wherein the second material is a silicon oxide and the p-type dopant is boron.

10. The design structure of claim 6 wherein the intrinsic base includes a portion on the active region of the substrate, and the portion of the extrinsic base occupying the first opening in the barrier layer lands on the portion of the extrinsic base.

* * * * *